(12) United States Patent
Wirtz

(10) Patent No.: US 7,646,470 B2
(45) Date of Patent: Jan. 12, 2010

(54) IMMERSION LITHOGRAPHIC PROCESS USING A VARIABLE SCAN SPEED

(75) Inventor: Rene Wirtz, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 12/013,511

(22) Filed: Jan. 14, 2008

(65) Prior Publication Data

US 2008/0297749 A1  Dec. 4, 2008

(30) Foreign Application Priority Data

May 31, 2007   (DE) .................. 10 2007 025 340

(51) Int. Cl.
*G03B 27/42* (2006.01)
*G03B 27/52* (2006.01)

(52) U.S. Cl. .......................... 355/53; 355/30

(58) Field of Classification Search ............ 355/30, 355/52, 53, 55, 67; 250/548; 356/399–401
See application file for complete search history.

(56) References Cited

U.S. PATENT DOCUMENTS

| | | | |
|---|---|---|---|
| 5,953,106 A * | 9/1999 | Unno et al. ............ | 355/55 |
| 5,986,742 A | 11/1999 | Straaijer et al. ........ | 355/53 |
| 6,753,948 B2 * | 6/2004 | Taniguchi .............. | 355/71 |
| 6,803,991 B2 * | 10/2004 | Mori ..................... | 355/53 |
| 6,879,381 B2 * | 4/2005 | Kenmoku ............... | 355/55 |
| 7,446,853 B2 * | 11/2008 | Fukuhara et al. ........ | 355/53 |
| 2006/0179730 A1 | 8/2006 | Kawashima et al. ..... | 355/55 |
| 2006/0197930 A1 * | 9/2006 | Kawashima et al. ..... | 355/55 |
| 2007/0188733 A1 * | 8/2007 | Ito et al. ............... | 355/77 |

OTHER PUBLICATIONS

Foreign associate transmittal letter mailed Feb. 11, 2008.
Translation of Official Communication Issued: Jan. 11, 2008.

* cited by examiner

*Primary Examiner*—Hung Henry Nguyen
(74) *Attorney, Agent, or Firm*—Williams, Morgan & Amerson

(57) ABSTRACT

A lithography system and a lithography method is provided for increasing reliability and efficiency of immersion lithography. By varying a scan speed between a wafer and an optical component depending on at least one process parameter during exposure of the wafer, loosening of a fluid meniscus during the relative movement of the optical component and the wafer is avoided.

16 Claims, 2 Drawing Sheets

IMMERSION LITHOGRAPHIC PROCESS USING A VARIABLE SCAN SPEED

BACKGROUND OF THE INVENTION

1. Field of the Invention

The present disclosure generally relates to the field of integrated circuit manufacture, and, more particularly, to a method and a system for immersion lithography.

2. Description of the Related Art

The formation of various integrated circuit (IC) structures on a wafer often relies on lithographic processes, sometimes referred to as photolithography or simply lithography. As is well known, lithographic processes may be used to transfer a pattern of a photomask (also referred to herein as a mask or a reticle) to a wafer.

For instance, a pattern may be formed from a photoresist layer disposed on the wafer by passing light energy through a reticle having an arrangement to image the desired pattern of the integrated circuit onto the photoresist layer. As a result, the pattern is transferred to the photoresist layer. Usually, after exposing the photoresist layer, a development cycle is performed, e.g., by an appropriate heat processing of the wafer. In areas where the photoresist is sufficiently exposed, the photoresist material may become soluble such that it may be removed to selectively expose an underlying layer, e.g., a semiconductor layer, a metal or metal-containing layer, a dielectric layer, a hard mask layer, etc. Portions of the photoresist layer not exposed to a threshold amount of light energy will not be removed and serve to protect the underlying layer during further processing of the wafer. Further processing of the layer may include, but is not limited to, etching exposed portions of the underlying layer, implanting ions into the wafer, etc. Thereafter, the remaining (protecting) portions of the photoresist layer may be removed.

There is an ongoing trend in IC fabrication to increase the density of the structures of the IC and, in particular, the density of the individual elements. As a result, there is a corresponding need to increase the resolution capability of lithography systems. Generally, the resolution of a lithography system is limited at least in part by the wavelength used to expose portions of the photoresist. In particular, the finest resolvable or critical dimension is proportional to the wavelength of the light used for exposure. Another limiting factor is the numerical aperture, the critical dimension being inversely proportional to the numerical aperture. Accordingly, there has been a trend to reduce the wavelength as well as increase the numerical aperture.

In modern systems, the reticle is not directly projected onto the wafer, but rather an imaging system is used to project the exposure pattern onto the wafer. Such an imaging system is capable of reducing the size of the structure defined by the reticle by a certain factor, e.g., a factor of 4 to 6. However, the imaging system cannot overcome the limitations imposed by the wavelength and the numerical aperture. Therefore, in order to further increase the resolution of the lithographic system, as an alternative to conventional "dry" lithography systems, an immersion lithography system has been proposed wherein the light is not transmitted to air or a vacuum from the imaging system to the wafer, but rather to an immersion lithography medium. Such an immersion lithography medium may be purified in de-ionized water for use in conjunction with a 193 nm light source, e.g., an argon fluorine (ArF) laser. For other wavelengths, other immersion mediums may be suitable. These immersion mediums replace an air or gas gap that is conventionally present between the final optical component of a conventional dry lithography imaging system and the wafer. However, attempts to implement immersion lithography have encountered a number of challenges. For example, minor variations or non-uniformities in the index of refraction of the immersion medium can adversely affect the quality of the exposure pattern incident on the wafer. The causes of change in the index of refraction of the immersion medium may include, for example, flow of the immersion medium, changes in the density of the immersion medium, changes in temperature of the immersion medium and so forth. A variation in temperature of the immersion medium may arise from part of the exposure radiation that is absorbed by an immersion medium. Further, since the immersion medium is in contact at least with the wafer, or with the wafer and the imaging system, heat may be transferred from the wafer to the immersion medium and/or from the imaging system to the immersion medium.

Usually, a wafer contains a plurality of individual devices. In order to increase the resolution and the quality of the exposure of the photoresist, a reticle is usually not configured for exposure of the whole wafer, but rather for exposure for only a part of the wafer. For example, the reticle may include the structure of one device or a few devices, e.g., four devices (dies). This means that, for exposing the whole wafer, the imaging system and the wafer have to be moved with respect to each other in order to expose the whole wafer step by step. Accordingly, systems of this type are usually referred to as steppers. Some steppers expose the whole reticle in one shot, whereas other types of lithographic systems only expose the whole width of the reticle at one time and exposure of the whole reticle is done by scanning the reticle in a direction perpendicular to the width.

It has been proposed to immerse the substrate in the lithographic system in the immersion medium having a relatively high refractive index, e.g., water. Other immersion liquids have been proposed, including water with solid particles, e.g., quartz, suspended therein. Still other systems propose the use of a conforming immersion medium such as a medium having a solid, semi-solid, gel-like or rubbery consistency. Submersing the wafer in a bath of liquid means that there is a large body of liquid that must be accelerated during a scanning exposure. This requires additional or more powerful motors. Further, the large amount of liquid may lead to an increased turbulence. Other systems propose the supply of liquid only to a localized area of the substrate between the imaging system and the wafer. Such a system, e.g., when using water as an immersion medium, requires a hydrophobic surface in order that the fluid meniscus is not lost during the scan.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique of varying relative scan speed between an optical component and a wafer during immersion lithography exposure of a wafer. To this end, at least one process parameter is taken into account for varying the scan speed during exposure of the wafer. The scan speed may be constant during a scan or may vary during a scan. Further, the scan speed may vary from one step to another, e.g., from one scan to another scan on the same wafer.

According to one illustrative embodiment disclosed herein, a lithography method comprises providing a wafer, providing an imaging system comprising an optical component for emitting an exposure pattern, and providing a fluid between the wafer and the optical component. The method further comprises moving the optical component and the wafer with respect to each other with a scan speed and varying the scan speed depending on at least one process parameter during exposure of the wafer.

In accordance with another illustrative embodiment disclosed herein, a lithography method comprises providing a wafer comprising a photosensitive layer, providing an imaging system comprising a lens for emitting an exposure pattern for exposing in the photosensitive layer, and providing an immersion medium between the wafer and the lens. The method also comprises moving the lens and the wafer with respect to each other with a scan speed and varying the scan speed depending on the position of the lens with regard to a wafer edge of the wafer.

According to still another illustrative embodiment disclosed herein, a lithography system comprises a wafer seat for receiving a wafer, an imaging system comprising an optical component for emitting an exposure pattern, a drive assembly for moving the wafer seat and the imaging system relative to each other, and a control unit for providing control signals to the drive assembly so as to vary a relative speed of the wafer seat and the imaging system in response to at least one process parameter.

BRIEF DESCRIPTION OF THE DRAWINGS

The disclosure may be understood by reference to the following description taken in conjunction with the accompanying drawings, in which like reference numerals identify like elements, and in which.

Figure 1:
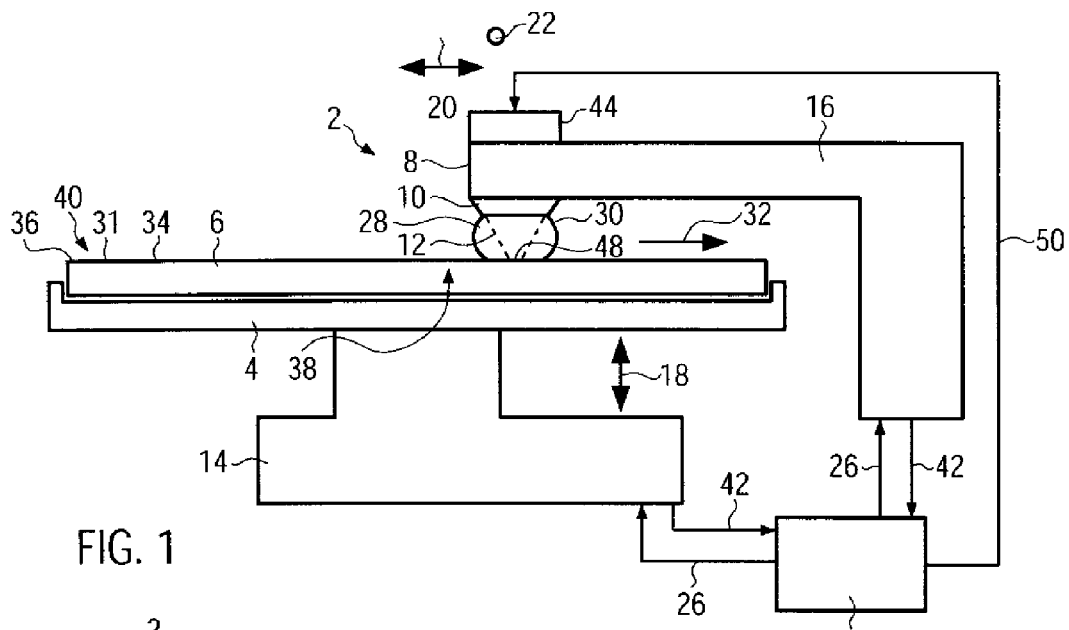
FIG. 1 schematically shows a lithography system according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The description herein is presented in the exemplary context of fabricating a wafer having an integrated circuit (IC) formed thereon. Examples of ICs include general purpose microprocessors including from thousands to hundreds of millions of transistors, a flash memory array or any other circuitry. However, the methods and devices described herein may also be applied to the fabrication of any device manufactured using lithography, such as micro machines, disk drive heads, gene chips, micro electro-mechanical systems and so forth. The apparatus and methods described herein may provide improved lithographic resolution while at the same time providing high operating speed in the high yield of wafers.

FIG. 1 shows an exemplary lithography system 2 in accordance with illustrative embodiments disclosed herein. The system 2 comprises a wafer seat 4 for receiving a wafer 6. The system 2 further comprises an imaging system 8 comprising an optical component 10 for emitting an exposure pattern 12. Further, the system 2 comprises a drive assembly for moving the wafer seat 4 and the imaging system 8 relative to each other. In the exemplary embodiment shown in FIG. 1, the drive assembly comprises a wafer related drive assembly 14 for moving the wafer seat in at least one direction. Further, the drive assembly of the system 2 comprises an imaging system related drive assembly 16 for moving the imaging system 8 in at least one direction. According to other embodiments, the drive assembly of the system 2 comprises only one of the wafer related drive assembly 14 and the imaging system related drive assembly 16. The drive assemblies may be capable of providing a linear movement. According to other illustrative embodiments, the drive assembly 14, 16 may be capable of providing a rotational movement of the respective components 4, 8. According to still other illustrative embodiments, the drive assembly 14, 16 may be capable of both a linear and a rotational movement of the respective components 4, 8. According to one embodiment illustrated in FIG. 1, the imaging system related drive assembly 16 is capable of moving the imaging system 8 over the wafer 6, i.e., it is capable of moving the imaging system 8 in a plane parallel to the wafer 6. In an illustrative embodiment, the wafer related drive assembly 14 is capable of moving the wafer seat 4 toward and away from the imaging system 8, e.g., in a vertical direction as illustrated in FIG. 1. The movability of the wafer related drive assembly 14 is indicated at 18 and the movability of the imaging system related drive assembly 16 is indicated at 20, 22.

The system 2 illustrated in FIG. 1 further comprises a control unit 24 for providing control signals 26 to the drive assembly 14, 16 so as to vary a relative speed of the wafer seat 4 and the imaging system 8 in response to at least one process parameter. Control signals in this sense include commands to the drive assembly 14, 16 as well as providing respective operating voltage to the drive assembly 14, 16. Accordingly, the drive assembly 14, 16 may consist of a motor or may comprise a motor and an additional motor control. The motor may be any suitable type of motor, e.g., an electric motor, a fuel motor, a pneumatic motor or the like.

According to one illustrative embodiment for performing a lithography process with the system 2 illustrated in FIG. 1, an immersion medium 28 is provided between the wafer 6 and the optical component 10 which emits the exposure pattern 12. A typical immersion medium used in accordance with the illustrative embodiments disclosed herein is a fluid. However, it should be understood that the term immersion medium includes a variety of mediums having very different viscosity. According to one embodiment, the immersion medium has a viscosity such that it shows no relevant elasticity on the time scales of the scan speed between the optical component 10 and the wafer 6. A typical immersion medium may be purified and de-ionized water which has been verified as suitable in conjunction with a 193 nm light radiation making up the exposure pattern 12. However, it should be understood that the use of water as an immersion medium is just an exemplary embodiment which does not limit the scope of the invention in any way. For example, a typical wavelength used in accordance with the illustrative embodiments disclosed herein may be a deep ultraviolet wavelength, e.g., about 248 nm, a vacuum ultraviolet (VUV) wavelength, e.g., about 157 nm, or an extreme ultraviolet wavelength. Further, even x-ray radiation may be used in accordance with the subject matter disclosed herein.

In accordance with one illustrative embodiment, the immersion medium 28 is held in place between the optical component 10 and the wafer 6 by its surface tension only. According to other embodiments, an air curtain may be provided for holding the immersion medium 28 in place or for assisting holding the immersion medium in place. However, any other configuration suitable for holding the immersion medium 28 in place may be used instead of or additionally. For example, in the case of water, a very hydrophobic surface may be needed on the wafer, in order not to lose the immersion medium meniscus during the scan. For example, as illustrated in FIG. 1, where the optical component 10 moves from left to right, as indicated by the arrow 32, the fluid meniscus 30 is distorted in the opposite direction, i.e., towards the left side. It should be understood that the terms left and right are only used for illustrative purposes and are in no way limiting. The higher the scan speed between the optical component 10 and the wafer 6, the more hydrophobic the surface 31 of the wafer 6 needs to be. For example, according to one illustrative embodiment, the wafer surface 31 is made more hydrophobic by applying an additional hydrophobic topcoat 34 on the wafer. However, at the wafer edge 36, this topcoat is usually removed together with the resist to yield a clean silicon wafer edge. Scanning over these areas with full speed can potentially lead to the loss of immersion medium from the meniscus onto the wafer, resulting in water droplets or watermark defects. In order to overcome this problem, according to one illustrative embodiment, an active scan speed control is used, i.e., by a reduction of the scan speed when scanning over the wafer edge 36. In other words, according to the illustrative embodiment shown in FIG. 1, the at least one process parameter in response to which the scan speed between the optical component 10 and the wafer 6 is varied is a deposition of the optical component with respect to a wafer edge. According to one illustrative embodiment, the scan speed between the optical component 2 and the wafer 6 is adjusted to a first speed in a center portion 38 of the wafer and the scan speed is adjusted to a second speed in an edge portion 40 of the wafer 6. In accordance with the embodiment described above, the first speed in the center portion 38 of the wafer 6 is higher than the second speed in the edge portion 40 of the wafer 6.

According to other illustrative embodiments, the at least one process parameter, depending on which the scan speed between the optical component 10 and the wafer 6 is varied, includes the position of the optical component with respect to the wafer, in general.

Generally, the relative position of the optical component 10 with respect to the wafer 6 may be deduced from process parameters inputted in advance to a lithography run, e.g., in the wafer size, and from position signals which may be obtained from the control unit 24 or from feedback signals 42 provided from the drive assemblies 14, 16. In particular, regarding the embodiment wherein the scan speed is varied according to the position of the optical component 10 with respect to the wafer edge 36, the control unit 24 may determine from the position signals of the drive assemblies 14, 16 and from the size of a wafer edge beat, which needs to be inputted into the scanner job in the illustrated embodiment, when the bare silicon part of the wafer contacts the immersion medium 28. In one illustrative embodiment, at this time, when the bare silicon part of the wafer contacts the immersion fluid 28, the scan speed between the optical component 10 and the wafer 6 is reduced. According to other embodiments, position sensors (not shown) may be provided to sense the position of respective movable components of the optical component 10 and the wafer seat 4.

Figure 2:
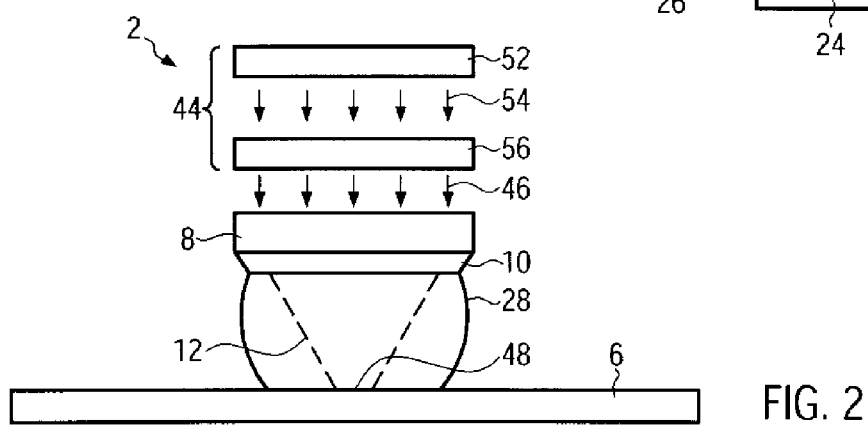
FIG. 2 schematically shows, in part, a lithography system according to illustrative embodiments disclosed herein.

FIG. 2 shows, in part, one illustrative embodiment of a lithography system 2. The system 2, illustrated in part in FIG. 2, comprises a radiation system 44 for generating a patterned radiation 46 from which the imaging system 8 generates the exposure pattern 12. According to the illustrated embodiment, the imaging system 8 generates an exposure pattern 12 which in turn generates an image 48 of the patterned radiation 46 on the substrate 6, wherein the image 48 on the substrate 6 is reduced in size with regard to the patterned radiation 46 by a certain factor, e.g., by a factor of 5.

According to the illustrative embodiment shown in FIG. 1, the control unit 24 further provides control signals 15 to the radiation system 44 to vary the radiation intensity of the patterned radiation and to enhance the exposure pattern 12 in response to the scan speed between the wafer seat 4 and the optical component 10. According to one illustrative embodiment, the control signals 50 are provided such that a predetermined radiation exposure per area unit is maintained constant during the varying of the scan speed. According to other embodiments, the radiation exposure per area unit is maintained within a predetermined interval.

FIG. 2 shows in greater detail the radiation system 44, and the imaging system 8 of the embodiment in FIG. 1. As illustrated in FIG. 2, the radiation system 44 generates a patterned radiation 46 which is projected by the imaging system 8 onto the wafer 6, or at least a portion thereof. The radiation system 44 comprises a radiation source 52 for generating a radiation 54 and a patterning component 56 for patterning the radiation 54 to thereby generate the patterned radiation 46. The patterning component may be reflective or transitive. For example, the patterning component may be a reticle which selectively blocks the radiation 54 emitted by the light source 52. For example, the reticle 56 maybe formed of an appropriately structured glass plate. The light source 52 may be a laser or any other light source providing radiation with a suitable wavelength and intensity. For example, the light source may even be an x-ray source or the like.

Figure 3:
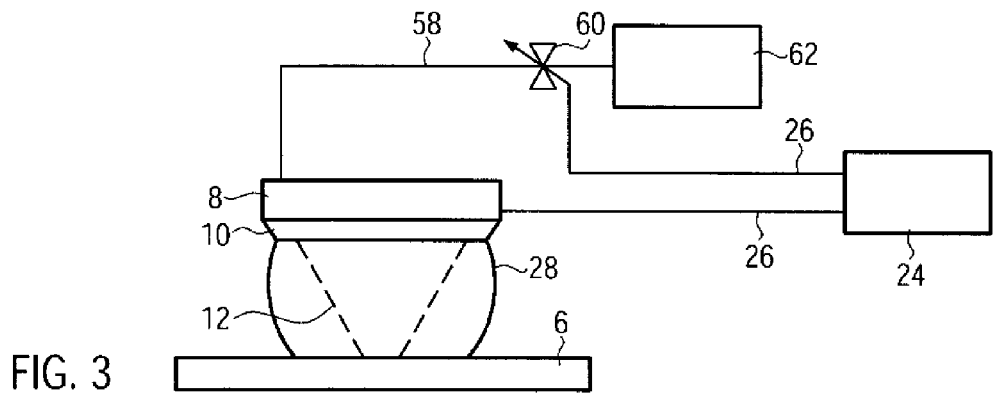
FIG. 3 schematically shows, in part, a lithography system according to illustrative embodiments disclosed herein.

FIG. 3 shows a lithography system according to further illustrative embodiments. In FIG. 3, like components compared to FIG. 1 have been denoted by the same reference signs, the description of which is not repeated here. The system illustrated in FIG. 3 further comprises a fluid supply 58 for supplying the immersion medium to the space between the optical component 10 and the wafer 6. According to one illustrative embodiment, the fluid supply 58 comprises a controllable valve 60 which is controllable by respective control signals 26 of the control unit 24. The controllable valve 60 is provided for controlling the supply of the immersion medium from an immersion medium source 62 to the space between the optical component 10 and the wafer 6.

Figure 4:
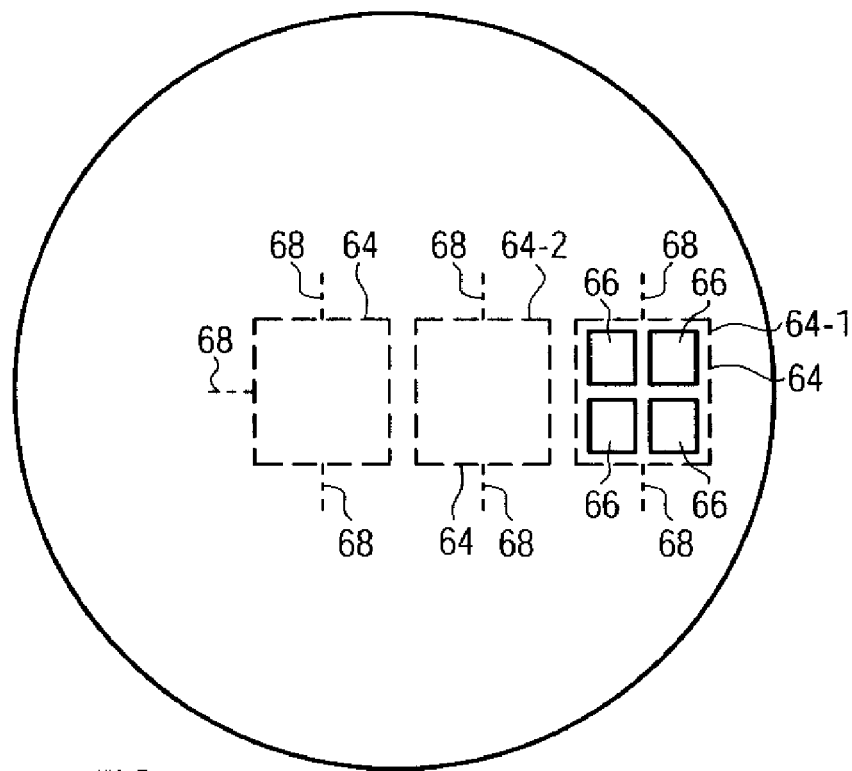
FIG. 4 schematically shows a wafer having integrated circuit devices thereon and illustrating an operational mode of a lithography system according to illustrative embodiments disclosed herein.

FIG. 4 illustrates an operation method of a lithography system 2 according to illustrative embodiments disclosed herein. FIG. 4 shows the top view of a wafer 6. FIG. 4 shows an embodiment of a stepper, which does not expose an entire wafer 6 at once. Instead, as is common to steppers, only a small portion of the wafer is exposed at once. The small portion is called a die. The area of the die is referred to as die size and this area can contain one or several integrated circuits. It should be noted that sometimes each individual integrated circuit is called a die. In FIG. 4, the exemplary die 64 comprises four integrated circuits 66. A lithography system 2 in the form of a wafer stepper steps the wafer from die to die, as indicated by the dots 68 in FIG. 4. In modern systems, a wafer stepper can cover the entire surface of an 8 inch wafer in about one minute. In the wafer stepper system 2, the wafer 6 and the reticle 56 are stationary during exposure. During stepping from one die portion 64-1 to another die portion 64-2, no exposure pattern is emitted from the optical component. According to one illustrative embodiment, the control unit 24 is configured for providing control signals 26 to the drive assembly 14, 16 so as to vary the relative speed of the wafer seat 4 and the imaging system 8 in response to at least one process parameter, such as during step movement wherein no exposure pattern is emitted from the optical component during stepping from one die portion 64-1 to another die portion 64-2. According to this embodiment, losing the immersion medium meniscus during stepping is avoided. Therefore, although the stepping itself may be carried out at a slower speed, the overall speed of the exposure of the whole wafer 6 is increased, since the exposure of the next die area 64-2 may continue immediately after positioning of the respective components, i.e., at least one of the wafer 6, the optical component 10, the reticle 56 and the light source 52.

Figure 5:
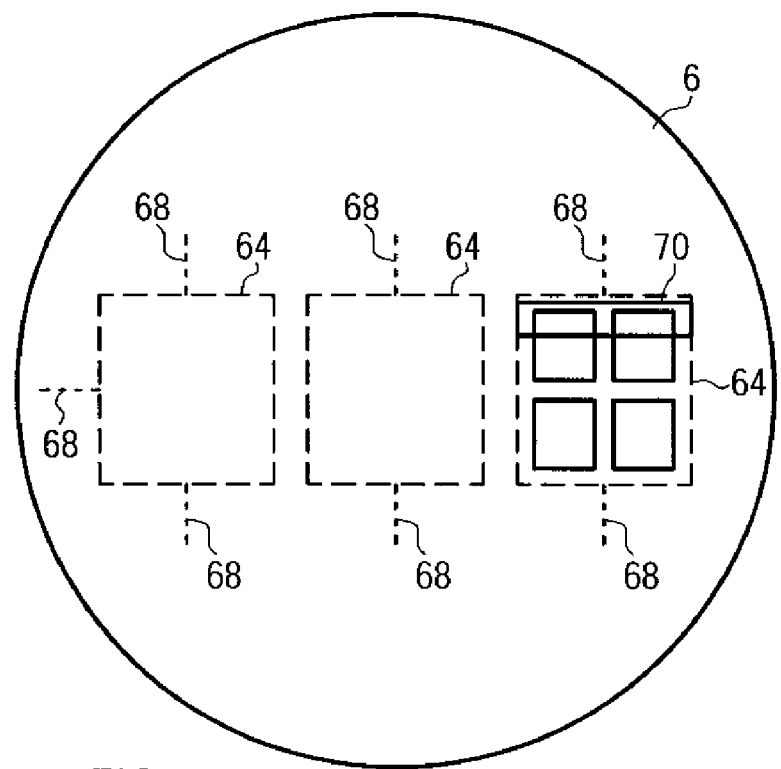
FIG. 5 schematically shows a top view of a wafer having a plurality of devices thereon and illustrating an operational method of a lithography system according to illustrative embodiments disclosed herein.

FIG. 5 shows a similar arrangement of die areas 64 over the wafer 6. However, according to the embodiment illustrated in FIG. 5, each die area 64 is not exposed at once. Rather, in a so-called step and scan system 2, as illustrated in FIG. 5, an elongated beam 70 of radiation 54 scans the image on the reticle 56 and exposes that image onto the wafer 6. This step and scan system 2 exposes each die 64 by moving the reticle 56 and the wafer 6 synchronously in different directions. According to other embodiments involving an appropriate imaging system 8, the reticle 56 and the wafer 6 may be moved in the same direction. Still other configurations may also be used in still further embodiments. After the scan, the system advances to the next die area 64, where the next die is exposed onto the wafer 6.

Regarding the details of the drive system 2 illustrated in FIG. 1, in order to provide a step and scan functionality, the drive assemblies 14, 16 may be configured as follows. For example, the drive assembly 16 may be configured to move the reticle 56 in a plane parallel to the wafer seat 4. Further, the drive assembly 14 may be configured for moving the wafer seat 4 in a plane parallel to the wafer 6 and parallel to the moving direction 20 of the drive assembly 16. Hence, by providing respective control signals 26 to the drive assemblies 14, 16 of the system 2 illustrated in FIG. 1, a correlated movement of the reticle 56 and the wafer 6 may be accomplished, e.g., the synchronous movement of the reticle 56 and the wafer 6 in opposite directions or in the same direction. According to one illustrative embodiment, the control unit is configured to provide control signals 26 to the drive assemblies 14, 16 so as to vary the relative speed of the wafer seat 4 and the imaging system 8 in response to at least one process parameter during a scan movement wherein the exposure pattern is emitted from the optical component, i.e., during a scan movement of the elongated beam 70 projecting the exposure pattern 12 onto the wafer 6 over the die area 64.

According to still other illustrative embodiments, the scan speed between the wafer seat 4 and the imaging system 8 is varied in response to at least one process parameter during a step movement wherein the system 2 is positioned to another die area 64, as well as during a scan movement during exposure of one die area 64 by an elongated beam 70.

The functionality of the control unit 24 maybe provided in hardware or in software. For example, the control unit 24 may comprise one or more processors for carrying out respective computer program products. For example, according to illustrative embodiments disclosed herein, each method disclosed herein may be accomplished by a respective computer program product which enables one or more processors to carry out the respective method. Such a computer program product may be provided in the form of a full release which provides the respective functionality. According to other illustrative embodiments, the respective computer program product may be provided as an update which adds the required functionality to an existing computer program product running in the control unit 24.

As a result, the subject matter disclosed herein provides a lithography system and a lithography method for increasing reliability and efficiency of immersion lithography. By varying a scan speed between a wafer and an optical component depending on at least one process parameter during exposure of the wafer, loosening of a fluid meniscus during the relative movement of the optical component and the wafer is avoided. Further, distortions of the fluid meniscus which may adversely affect the projection of the desired pattern onto the wafer may at least be reduced. The principle of varying the scan speed depending on at least one process parameter may be employed for any movement between the optical component and the wafer. For example, it may be employed for stepping from one die area to another die area of a stepper. Further, it may be employed for the scanning movement of the wafer during scanning of one die area in a step and scan system. According to still other embodiments, variation of the scan speed may be employed for both of these movements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A lithography method, comprising:
   providing a wafer comprising a top surface that comprises a center region and an edge region that is less hydrophobic than the center region;
   providing an imaging system comprising an optical component for emitting an exposure pattern;
   providing an immersion medium between said wafer and said optical component;
   moving said optical component and said wafer with respect to each other with a scan speed; and
   varying said scan speed during exposure of said wafer, when the imaging system passes between the center region and the edge region so that a change in the hydrophobicity of the top surface proximate the imaging system causes a variation in a strength of an interaction between the immersion medium and said wafer.

2. The method of claim 1, wherein moving said optical component and said wafer with respect to each other comprises a movement before emitting said exposure pattern.

3. The method of claim 1, wherein moving said optical component and said wafer with respect to each other comprises a movement during emitting said exposure pattern.

4. The method of claim 1, further comprising adjusting the intensity of the exposure pattern to the scan speed to maintain a predetermined radiation exposure per unit area.

5. The method of claim 1, wherein the immersion medium comprises water, and wherein varying said scan speed comprises reducing the scan speed near the wafer edge when the position of the optical component indicates that a hydrophobicity of the wafer has increased near the wafer edge.

6. The method of claim 5, wherein the immersion medium is held in place between the optical component and the wafer by the surface tension of the immersion medium, thereby forming a meniscus, and wherein varying said scan speed comprises varying said scan speed to avoid loss of the immersion medium from the meniscus.

7. A lithography method, comprising:
   providing a wafer comprising a photosensitive layer comprising a top surface that comprises a center region and an edge region that is less hydrophobic than the center region;
   providing an imaging system comprising a lens for emitting an exposure pattern for exposing said photosensitive layer;
   providing an immersion medium between the wafer and the lens;
   moving said lens and said wafer with respect to each other with a scan speed; and
   varying said scan speed depending on the position of the lens with regard to a wafer edge of the wafer, when the imaging system passes between the center region and the edge region so that a change in the hydrophobicity of the top surface proximate the imaging system causes a variation in a strength of an interaction between the immersion medium and said wafer.

8. The method of claim 7, wherein the immersion medium comprises water, and further comprising:
   adjusting the scan speed to a first speed in the center portion of the wafer that is relatively more hydrophobic; and
   adjusting the scan speed to a second speed in the edge portion of the wafer that is relatively less hydrophobic than the center portion of the wafer; wherein the first speed is higher than the second speed.

9. A lithography system, comprising:
   a wafer seat for receiving a wafer comprising a top surface that comprises a center region and an edge region that is less hydrophobic than the center region;
   an imaging system comprising an optical component for emitting an exposure pattern;
   an immersion medium positioned between said wafer and said optical component;
   a drive assembly for moving said wafer seat and said imaging system relative to each other; and
   a control unit for providing control signals to said drive assembly so as to vary a relative speed of said wafer seat and said imaging system when the imaging system passes between the center region and the edge region so that a change in the hydrophobicity of the top surface proximate the imaging system causes a variation in a strength of an interaction between the immersion medium and said wafer.

10. The system of claim 9, further comprising:
    a radiation system for generating a patterned radiation source for generating a radiation and a patterning component for patterning said radiation, the patterning component being transmissive or reflective, wherein said optical component generates said exposure pattern from said patterned radiation;
    said control unit further providing control signals to said radiation system so as to vary said radiation intensity in response to variations in said relative speed of said wafer seat and said imaging system.

11. The system of claim 9, wherein said optical component is a lens.

12. The system of claim 9, wherein said control unit is configured to provide control signals to said drive assembly so as to vary the relative speed of said wafer seat and said imaging system during a step movement wherein no exposure pattern is emitted from the optical component.

13. The system of claim 9, wherein said control unit is configured to provide control signals to said drive assembly so as to vary the relative speed of said wafer seat and said imaging system during a scan movement wherein said exposure pattern is emitted from the optical component.

14. The system of claim 9, wherein the immersion medium comprises water, and wherein varying said relative speed comprises reducing the relative speed near the wafer edge when a position of the optical component indicates that a hydrophobicity of the wafer has increased near the wafer edge.

15. The system of claim 9, further comprising an immersion medium holding arrangement configured for holding the immersion medium in place between the optical component and the wafer by the surface tension of the immersion medium, thereby forming a meniscus, and wherein varying said relative speed comprises varying said relative speed to avoid loss of the immersion medium from the meniscus.

16. The system of claim 9, further comprising an immersion medium supply for supplying said immersion medium to a space between said optical component and a wafer received in said wafer seat.

* * * * *